(12) United States Patent
Ichihara et al.

(10) Patent No.: US 8,988,925 B2
(45) Date of Patent: Mar. 24, 2015

(54) NONVOLATILE SEMICONDUCTOR MEMORY DEVICE IN WHICH POLARITIES OF VOLTAGES IN FORMING OPERATION AND SET OPERATION ARE DIFFERENT FROM EACH OTHER

(75) Inventors: Reika Ichihara, Yokohama (JP); Takayuki Tsukamoto, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 13/597,318

(22) Filed: Aug. 29, 2012

(65) Prior Publication Data
US 2012/0320662 A1 Dec. 20, 2012

Related U.S. Application Data

(63) Continuation of application No. 12/886,931, filed on Sep. 21, 2010, now Pat. No. 8,274,815.

(30) Foreign Application Priority Data

Mar. 2, 2010 (JP) .................................. 2010-045055

(51) Int. Cl.
*G11C 11/00* (2006.01)
*G11C 13/00* (2006.01)

(52) U.S. Cl.
CPC ........ *G11C 11/00* (2013.01); *G11C 2013/0083* (2013.01)
USPC ............................ 365/148; 365/163; 365/175

(58) Field of Classification Search
CPC ........... G11C 2213/10; G11C 2213/32; G11C 2213/71; G11C 2213/72; G11C 2243/82
USPC ......................................... 365/148, 163, 175
See application file for complete search history.

(56) References Cited

U.S. PATENT DOCUMENTS

| 7,443,721 B2 | 10/2008 | Kurotsuchi et al. |
| 7,911,824 B2 | 3/2011 | Kawai et al. |

(Continued)

FOREIGN PATENT DOCUMENTS

| JP | 2005-522045 | 7/2005 |
| JP | 2006-514393 | 4/2006 |

(Continued)

OTHER PUBLICATIONS

Office Action issued Jul. 3, 2012 in Japanese Application No. 2010-045055 filed Mar. 2, 2010 (w/English translation).

*Primary Examiner* — Vanthu Nguyen
(74) *Attorney, Agent, or Firm* — Oblon, McClelland, Maier & Neustadt, L.L.P.

(57) ABSTRACT

A nonvolatile semiconductor memory device in accordance with an embodiment comprises a plurality of first, second lines, a plurality of memory cells, and a control circuit. The plurality of second lines extend so as to intersect the first lines. The plurality of memory cells are disposed at intersections of the first, second lines, and each includes a variable resistor. The control circuit is configured to control a voltage applied to the memory cells. The control circuit applies a first pulse voltage to the variable resistor during a forming operation. In addition, the control circuit applies a second pulse voltage to the variable resistor during a setting operation, the second pulse voltage having a polarity opposite to the first pulse voltage. Furthermore, the control circuit applies a third pulse voltage to the variable resistor during a resetting operation, the third pulse voltage having a polarity identical to the first pulse voltage.

9 Claims, 9 Drawing Sheets

| Combination | Forming | Setting | Resetting |
|---|---|---|---|
| C1 | +Pulse | −Pulse | +Pulse |
| C2 | −Pulse | +Pulse | −Pulse |

+direction: WL→BL
−direction: BL→WL
*Pulse Width During Resetting Operation:
Less Than 1 μs

(56) References Cited

U.S. PATENT DOCUMENTS

| | | | |
|---|---|---|---|
| 8,022,502 B2* | 9/2011 | Kanzawa et al. | 257/529 |
| 2007/0159867 A1* | 7/2007 | Muraoka et al. | 365/100 |
| 2009/0272962 A1* | 11/2009 | Kumar et al. | 257/4 |
| 2009/0279344 A1* | 11/2009 | Toda | 365/148 |
| 2010/0046270 A1 | 2/2010 | Katoh et al. | |
| 2010/0073983 A1* | 3/2010 | Hosoi | 365/51 |

FOREIGN PATENT DOCUMENTS

| | | |
|---|---|---|
| JP | 2007-80311 | 3/2007 |
| JP | 2008-34641 | 2/2008 |
| JP | 2008-210441 | 9/2008 |
| WO | WO 2009/107370 | 9/2009 |
| WO | WO 2010/021134 | 2/2010 |

* cited by examiner

| Combination | Forming | Setting | Resetting |
|---|---|---|---|
| C1 | +Pulse | −Pulse | +Pulse |
| C2 | −Pulse | +Pulse | −Pulse |

+direction: WL→BL
−direction: BL→WL
*Pulse Width During Resetting Operation:
Less Than 1 μs

NONVOLATILE SEMICONDUCTOR MEMORY DEVICE IN WHICH POLARITIES OF VOLTAGES IN FORMING OPERATION AND SET OPERATION ARE DIFFERENT FROM EACH OTHER

CROSS-REFERENCE TO RELATED APPLICATIONS

This application is a continuation of and claims the benefit of priority under 35 U.S.C. §120 from U.S. Ser. No. 12/886,931 filed Sep. 21, 2010, and claims the benefit of priority under 35 U.S.C. §119 from Japanese Patent Application No. 2010-45055 filed Mar. 2, 2010, the entire contents of each of which are incorporated herein by reference.

FIELD

Embodiments described in the specification relate to a nonvolatile semiconductor memory device including electrically rewritable memory cells.

BACKGROUND

In recent years, along with a rising level of integration in semiconductor devices, circuit patterns of transistors and so on configuring these semiconductor devices are being increasingly miniaturized. Required in this miniaturization of the patterns is not simply a thinning of line width but also an improvement in dimensional accuracy and positioning accuracy of the patterns. This trend applies also to semiconductor memory devices.

Conventionally known and marketed semiconductor memory devices such as DRAM, SRAM, and flash memory each use a MOSFET as a memory cell. Consequently, there is required, accompanying the miniaturization of patterns, an improvement in dimensional accuracy at a rate exceeding a rate of the miniaturization. As a result, a large burden is placed also on the lithography technology for forming these patterns which is a factor contributing to a rise in product cost.

Furthermore, resistance varying memory is attracting attention as a candidate to succeed these kinds of semiconductor memory devices employing a MOSFET as a memory cell. The resistance varying memory herein includes phase change memory (PCRAM: Phase Change RAM), in addition to the resistance varying memory (ReRAM: Resistive RAM). The resistance varying memory uses a transition metal oxide as a recording layer to store a resistance state of the transition metal oxide in a non-volatile manner. The phase change memory uses chalcogenide or the like as a recording layer to utilize resistance information of a crystalline state (conductor) and an amorphous state (insulator).

Two kinds of variable resistors in the aforementioned resistance varying memory are known, namely a unipolar type and a bipolar type. In the case of bipolar type resistance varying memory, the variable resistor is applied with a voltage pulse (write pulse, erase pulse) of different polarity for a setting operation (write) and a resetting operation (erase). In the setting operation, the variable resistor shifts from a high-resistance state to a low-resistance state, and in the resetting operation, the variable resistor shifts from the low-resistance state to the high-resistance state.

On the other hand, in the case of unipolar type resistance varying memory, the variable resistor shifts to the high-resistance state or low-resistance state as a result of conditions such as amplitude and time of an applied voltage pulse. Accordingly, in the unipolar type, there occurs a phenomenon known as incorrect write where, during application of the erase pulse to the variable resistor, a write is performed again subsequent to erase being performed. Since most resistance varying memories actually capable of manufacture have unipolar characteristics as well as bipolar characteristics, the problem of incorrect write in these resistance varying memories remains unsolved.

DETAILED DESCRIPTION

Figure 1:
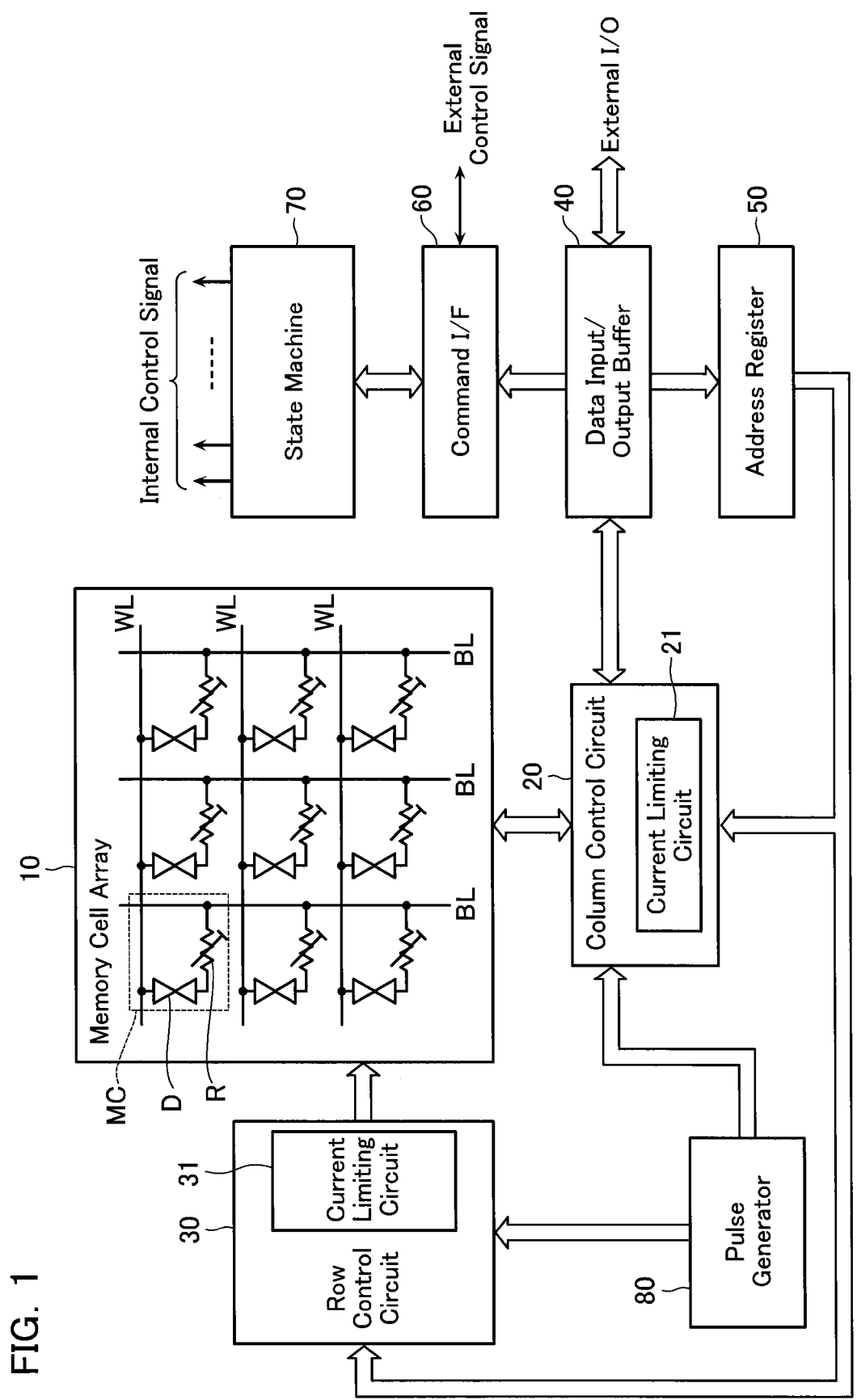
FIG. 1 is a block diagram showing a nonvolatile semiconductor memory device in accordance with a first embodiment of the present invention.

A nonvolatile semiconductor memory device in accordance with an embodiment comprises a plurality of first lines, a plurality of second lines, a plurality of memory cells, and a control circuit. The plurality of second lines extend so as to intersect the first lines. The plurality of memory cells are disposed at intersections of the first lines and the second lines, and each includes a variable resistor. The control circuit is configured to control a voltage applied to the memory cells. The control circuit applies a first pulse voltage to the variable resistor during a forming operation. In addition, the control circuit applies a second pulse voltage to the variable resistor during a setting operation, the second pulse voltage having a polarity opposite to the first pulse voltage. Furthermore, the control circuit applies a third pulse voltage to the variable resistor during a resetting operation, the third pulse voltage having a polarity identical to the first pulse voltage.

A nonvolatile semiconductor memory device in accordance with another embodiment comprises a plurality of first lines, a plurality of second lines, a plurality of memory cells, and a control circuit. The plurality of second lines extend so as to intersect the first lines. The plurality of memory cells are disposed at intersections of the first lines and the second lines, and each includes a variable resistor. The control circuit is configured to control a voltage applied to the memory cells. The control circuit applies a first pulse voltage to the variable resistor during a forming operation. In addition, the control circuit applies a second pulse voltage to the variable resistor during a setting operation, the second pulse voltage having a polarity opposite to the first pulse voltage. The control circuit comprises a current limiting circuit for limiting a current flowing in the memory cells in a first direction and in a second direction, the second direction being an opposite direction to the first direction.

A nonvolatile semiconductor memory device in accordance with yet another embodiment comprises a plurality of first lines, a plurality of second lines, a plurality of memory cells, and a control circuit. The plurality of second lines extend so as to intersect the first lines. The plurality of memory cells are disposed at intersections of the first lines and the second lines, and each includes a variable resistor. The control circuit is configured to control a voltage applied to the memory cells. The control circuit applies a first pulse voltage to the variable resistor during a forming operation. In addition, the control circuit applies a third pulse voltage to the variable resistor during a resetting operation, the third pulse voltage having a polarity identical to the first pulse voltage. The control circuit comprises a current limiting circuit for limiting a current flowing in the memory cells in a first direction and in a second direction, the second direction being an opposite direction to the first direction.

Embodiments of a nonvolatile semiconductor memory device in accordance with the present invention are described below with reference to the drawings.

First Embodiment

Configuration

FIG. 1 is a block diagram of a nonvolatile semiconductor memory device in accordance with a first embodiment of the present invention. As shown in FIG. 1, the nonvolatile semiconductor memory device in accordance with the first embodiment includes a memory cell array 10, a column control circuit 20, a row control circuit 30, a data input/output buffer 40, an address register 50, a command I/F 60, a state machine 70, and a pulse generator 80.

The memory cell array 10 includes word lines WL and bit lines BL configured to intersect each other, and memory cells MC disposed at intersections of the word lines WL and the bit lines BL, as shown in FIG. 1. The word lines WL are formed extending in an X direction and arranged having a certain pitch in a Y direction. The bit lines BL are formed extending in the Y direction and arranged having a certain pitch in the X direction. That is, the memory cells MC are disposed in a matrix on a surface formed by the X direction and the Y direction.

Each of the memory cells MC includes a bidirectional diode D and a variable resistor R connected in series. The bidirectional diode D has one end connected to the word line WL and the other end connected to one end of the variable resistor R. The other end of the variable resistor R is connected to the bit line BL. The variable resistor R is configured to have its resistance value varied and to store data in a nonvolatile manner based on the resistance value.

The variable resistor R is an element configured to shift between at least two resistance values of, for example, a low-resistance state and a high-resistance state. The variable resistor R shifts from the high-resistance state to the low-resistance state when applied with a certain pulse voltage (write operation, setting operation). In addition, the variable resistor R shifts from the low-resistance state to the high-resistance state when applied with a pulse voltage of an opposite polarity to the setting operation (erase operation, resetting operation).

The column control circuit 20 controls the bit lines BL of the memory cell array 10 to perform data erase of the memory cells MC (resetting operation), data write to the memory cells MC (setting operation), and data read from the memory cells MC. In addition, the column control circuit 20 includes a current limiting circuit 21. The current limiting circuit 21 limits a current flowing from the bit line BL via the memory cell MC to the word line WL.

The row control circuit 30 selects the word lines WL of the memory cell array 10 to apply a voltage required in data erase of the memory cells MC (resetting operation), data write to the memory cells MC (setting operation), and data read from the memory cells MC. In addition, the row control circuit 30 includes a current limiting circuit 31. The current limiting circuit 31 limits a current flowing from the word line WL via the memory cell MC to the bit line BL.

The data input/output buffer 40 is connected via an I/O line to an external host not shown, and is configured to receive write data, receive erase instructions, output read data, and receive address data and command data. The data input/output buffer 40 sends received write data to the column control circuit 20, and receives read data from the column control circuit 20 to be output to external.

The address register 50 sends addresses supplied to the data input/output buffer 40 from the host to the column control circuit 20 and the row control circuit 30.

The command interface 60 receives commands supplied to the data input/output buffer 40 from the host. The command interface 60 receives an external control signal from the host, judges whether data inputted to the data input/output buffer 40 is write data, a command or an address, and, if the data is a command, receives the data and transfers the data to the state machine 70 as a command signal.

The state machine 70 performs management of the nonvolatile memory overall, and receives commands from the host to perform management of read, write, erase, input/output of data, and so on. Moreover, it is also possible for the external host to receive status information managed by the status machine 70 and judge operation results. This status information may additionally be used for control of write and erase.

The pulse generator 80 is controlled by the state machine 70. This control enables the pulse generator 80 to output a pulse of arbitrary voltage and arbitrary timing. Now, the pulse formed may be transferred to an arbitrary line selected by the column control circuit 20 and row control circuit 30. Note that peripheral circuit elements other than the memory cell array 10 are formable on a Si substrate directly below the memory cell array 10 formed in a wiring layer, thus enabling chip area of the nonvolatile memory to be set substantially equal to area of the memory cell array 10.

Figure 2:
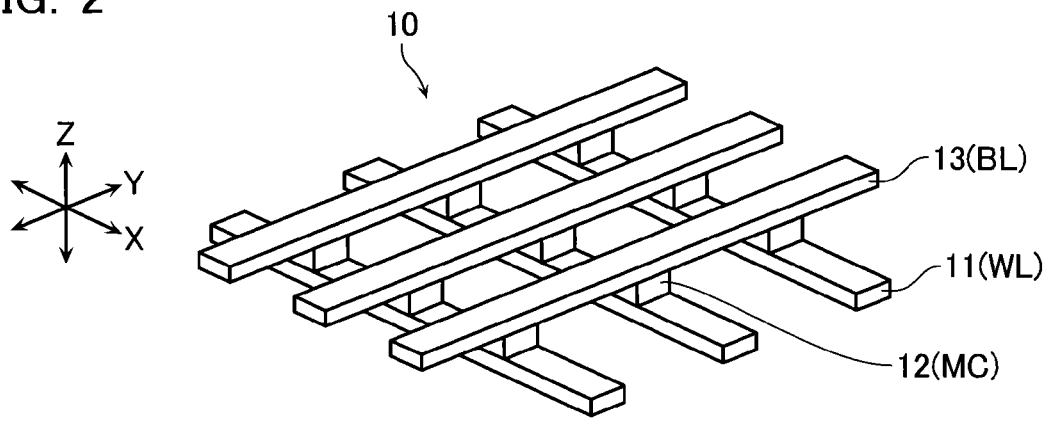
FIG. 2 is a perspective view showing a memory cell array 10.

Next, a stacking structure of the memory cell array 10 in accordance with the first embodiment is described in detail with reference to FIG. 2. FIG. 2 is a perspective view showing the memory cell array 10. The memory cell array 10 is configured as a so-called cross-point type.

As shown in FIG. 2, the memory cell array 10 includes, from a lower layer to an upper layer, a first conductive layer 11, a memory layer 12, and a second conductive layer 13. The first conductive layer 11 functions as the word line WL. The memory layer 12 functions as the memory cell MC. The second conductive layer 13 functions as the bit line BL.

The first conductive layer 11 is formed in stripes extending in an X direction and having a certain pitch in a Y direction, as shown in FIG. 2. The first conductive layer 11 is preferably a heat-resistant low-resistance material, configured by any of tungsten (W), tungsten silicide (WSi), nickel silicide (NiSi), cobalt silicide (CoSi), or the like.

The memory layer 12 is provided on the first conductive layer 11 and arranged in a matrix in the X direction and the Y direction, as shown in FIG. 2.

The second conductive layer 13 is formed in stripes extending in the Y direction and having a certain pitch in the X direction, as shown in FIG. 2. The second conductive layer 13 is formed in contact with an upper surface of the memory layer 12. The second conductive layer 13 is preferably a heat-resistant low-resistance material, configured by any of tungsten (W), tungsten silicide (WSi), nickel silicide (NiSi), cobalt silicide (CoSi), or the like.

Figure 3:
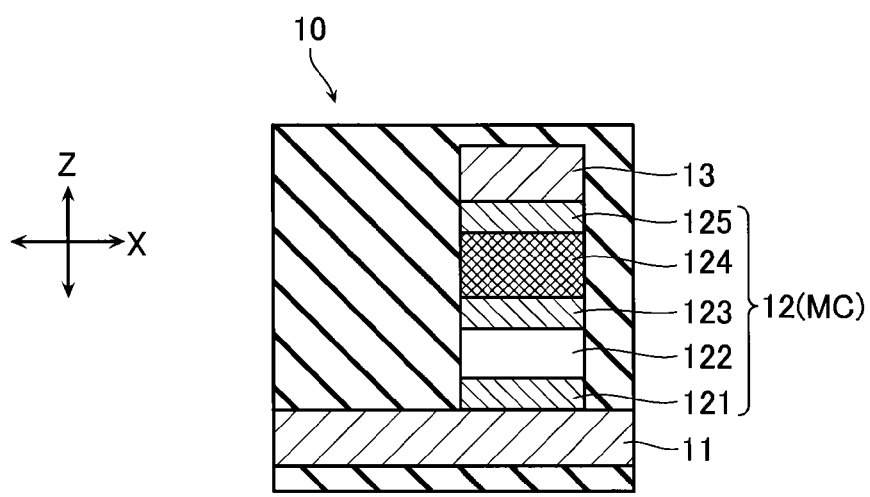
FIG. 3 is a cross-sectional view of FIG. 2.

Next, a stacking structure of the memory layer 12 is described in detail with reference to FIG. 3. FIG. 3 is a cross-sectional view of FIG. 2. As shown in FIG. 3, the memory layer 12 includes, from a lower layer to an upper layer, an electrode layer 121, a diode layer 122, an electrode layer 123, a variable resistance layer 124, and an electrode layer 125.

The electrode layer 121 is formed on an upper surface of the first conductive layer 11. The electrode layer 121 is configured by titanium (Ti) or titanium nitride (TiNx), or by a stacking structure of these titanium (Ti) and titanium nitride (TiNx).

The diode layer 122 is formed on an upper surface of the electrode layer 121. The diode layer 122 functions as the bidirectional diode D. The electrode layer 123 is formed on an upper surface of the diode layer 122. The electrode layer 123 is configured by a similar material to the electrode layer 121.

The variable resistance layer 124 is formed on an upper surface of the electrode layer 123. The variable resistance layer 124 functions as the variable resistor R. The electrode layer 125 is formed between an upper surface of the variable resistance layer 124 and a lower surface of the second conductive layer 13. The electrode layer 125 is configured by a similar material to the electrode layer 121.

Figure 4:
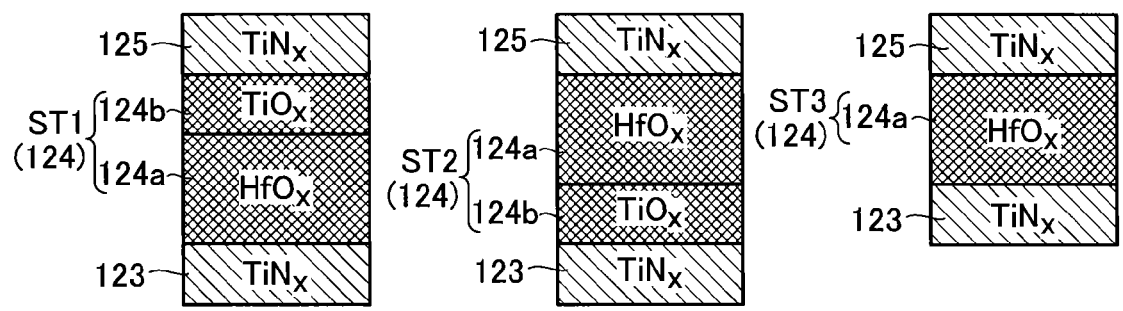
FIG. 4 is across-sectional view showing a variable resistance layer 124.

Next, a configuration of the variable resistance layer 124 is described in detail with reference to FIG. 4. The variable resistance layer 124 may adopt any of structures ST1 to ST3, as shown in FIG. 4. The structure ST1 (variable resistance layer 124) includes, from a lower layer to an upper layer, a metal oxide layer 124a configured by hafnium oxide (HfOx) and a metal oxide layer 124b configured by titanium oxide (TiOx). The structure ST2 (variable resistance layer 124) includes, from a lower layer to an upper layer, the metal oxide layers 124b and 124a, in a reverse order to the structure ST1. The structure ST3 (variable resistance layer 124) includes only the metal oxide layer 124a. In the first embodiment, either of structure ST1 or structure ST2 is preferable over structure ST3, thereby allowing incorrect writes during the resetting operation to be suppressed. Note that details of this advantage are described hereafter.

[Operation]

Figures 5, 6:
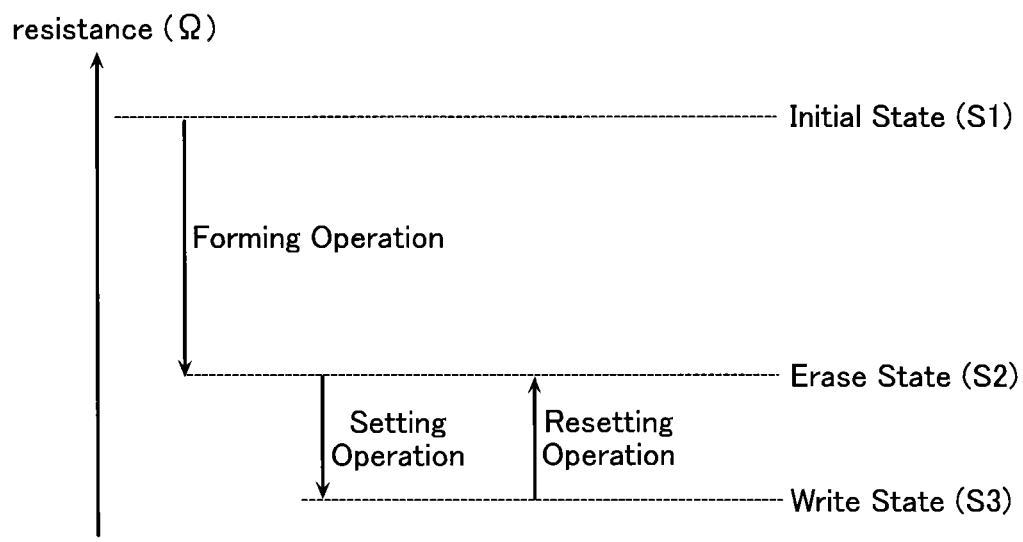
FIG. 5 is a view explaining a forming operation, a setting operation, and a resetting operation.
FIG. 6 is a view showing combinations (C1, C2) of polarity of pulse voltage in the various operations.

Next, varying of the resistance value of the variable resistor R is described with reference to FIG. 5. As shown in FIG. 5, the variable resistor R is in a highest resistance state in an initial state (S1) immediately after manufacture. A forming operation is then executed on the variable resistor R to allow the variable resistor R to function as a part of the memory cell MC. As a result, the variable resistor R attains an erase state (S2), the resistance value of the erase state (S2) being set lower than that of the initial state (S1).

Then, when a setting operation is executed as a memory cell MC operation, the variable resistor R changes from the erase state (S2) to a write state (S3), the resistance value of the write state (S3) being set lower than that of the erase state (S2). In addition, when a resetting operation is executed, the variable resistor R changes back from the write state (S3) to the erase state (S2), the resistance value of the erase state (S2) being set higher than that of the write state (S3).

Now, at the moment when the variable resistor R has its resistance lowered, the current flowing in the memory cell MC increases, thereby causing element characteristics to deteriorate. Accordingly, the first embodiment has current limiting circuits 21 and 31 which cause the current flowing from the bit line BL to the word line WL and the current flowing from the word line WL to the bit line BL to be limited.

Next, a method for applying a pulse voltage for the forming operation, the setting operation, and the resetting operation in the first embodiment is described with reference to FIG. 6. FIG. 6 shows combinations (C1, C2) of polarity of pulse voltage in the various operations.

Now, a "+direction" indicates hereafter a direction proceeding from the word line WL via the memory cell MC (variable resistor R) to the bit line BL. In addition, a "−direction" indicates a direction proceeding from the bit line BL via the memory cell MC (variable resistor R) to the word line WL. A "+pulse voltage" indicates a pulse voltage where current flows in the "+direction", and a "−pulse voltage" indicates a pulse voltage where current flows in the "−direction". That is, the "−pulse voltage" has a reverse polarity of the "+pulse voltage". A "+forming element R" indicates a variable resistor R applied with the "+pulse voltage" as a forming pulse. A "−forming element R" indicates a variable resistor R applied with the "−pulse voltage" as a forming pulse. Note that application of the +pulse voltage and the −pulse voltage is executed by the column control circuit 20 and the row control circuit 30.

In the combination C1 of FIG. 6, the variable resistor R is applied with a "+pulse voltage" during the forming operation to become a +forming element R. In the case of this combination C1, the +forming element R is applied with a "−pulse voltage" during the setting operation. Additionally in the case of this combination C1, the +forming element R is applied with a "+pulse voltage" during the resetting operation. A pulse width of the "+pulse voltage" during resetting is less than 1 μs.

In the combination C2 of FIG. 6, the variable resistor R is applied with a "−pulse voltage" during the forming operation to become a −forming element R. In the case of this combination C2, the −forming element R is applied with a "+pulse voltage" during the setting operation. Additionally in the case of this combination C2, the −forming element R is applied with a "−pulse voltage" during the resetting operation. A pulse width of the "−pulse voltage" during resetting is less than 1 μs.

The above-described combinations C1 and C2 of +pulse voltages and −pulse voltages shown in FIG. 6 make it possible in the first embodiment for the pulse voltage to be reduced during setting and for incorrect writes to be suppressed during resetting. Moreover, setting the pulse width to less than 1 μs in the first embodiment allows incorrect writes to be further suppressed. Note that details of these advantages are described hereafter.

[Results of Experiments]

Figure 7A:
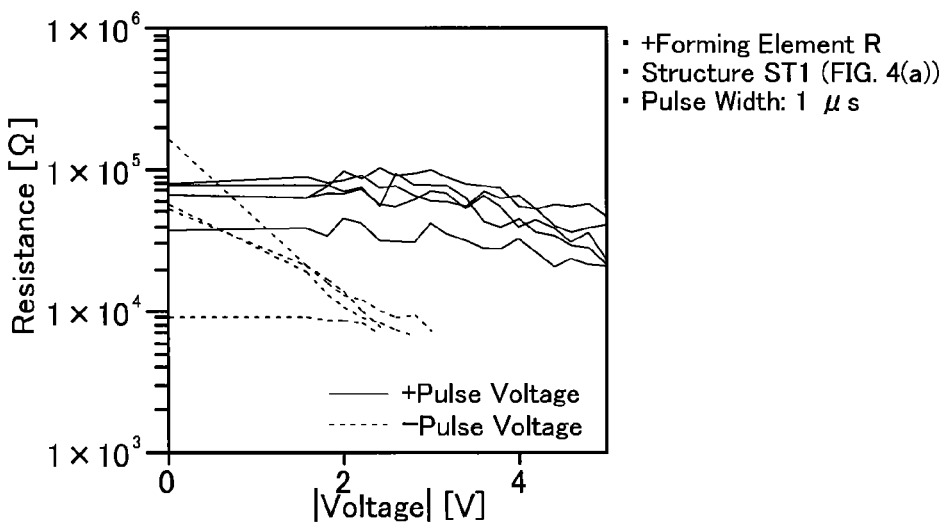
FIG. 7A is a view showing resistance varying characteristics of a +forming element R.
Figure 7B:
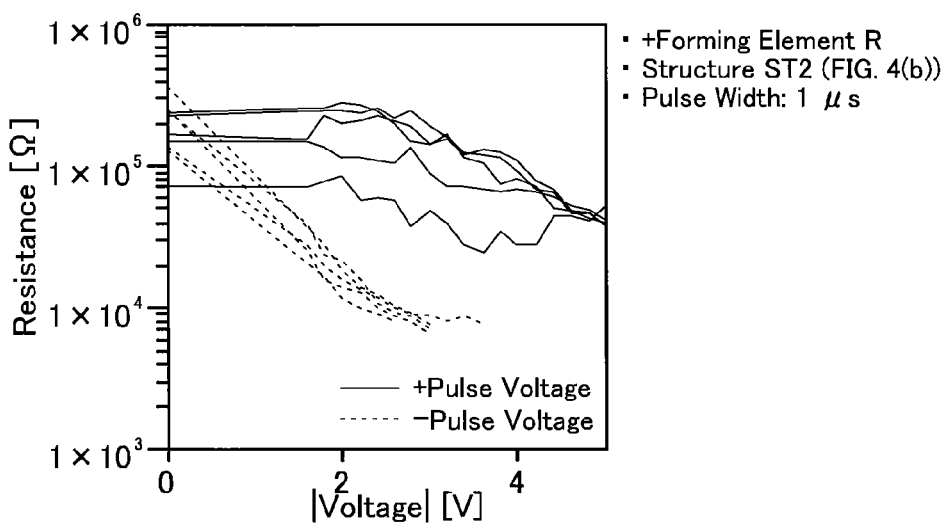
FIG. 7B is a view showing resistance varying characteristics of a +forming element R.
Figure 7C:
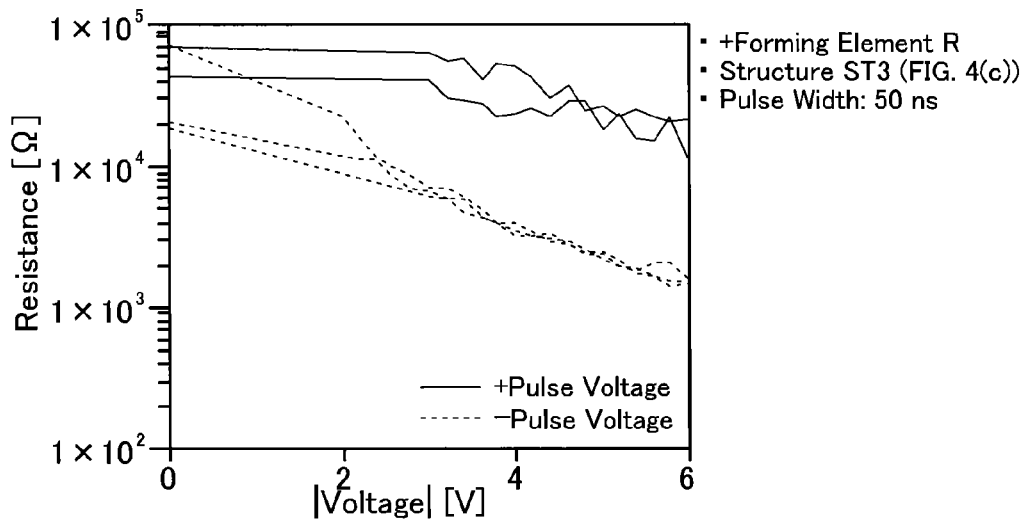
FIG. 7C is a view showing resistance varying characteristics of a +forming element R.

Next, results of various experiments are described. First, resistance varying characteristics of a +forming element R are described with reference to FIGS. 7A to 7C. In FIGS. 7A to 7C, the horizontal axis indicates the absolute value of the pulse voltage applied to the +forming element R, and the vertical axis indicates the resistance value of the +forming element R. FIG. 7A shows results in the case where the variable resistance layer 124 of structure ST1 (FIG. 4) was adopted as the +forming element R. In addition, FIG. 7B shows results in the case where the variable resistance layer 124 of structure ST2 (FIG. 4) was adopted as the +forming element R, and FIG. 7C shows results in the case where the variable resistance layer 124 of structure ST3 (FIG. 4) was adopted as the +forming element R. Note that in FIGS. 7A and 7B, a pulse voltage of width 1 μs was applied, and in FIG. 7C, a pulse voltage of width 50 ns was applied.

As shown in FIGS. 7A to 7C, in each of the variable resistance layers 124 of structures ST1 to ST3, application of the "−pulse voltage" caused the +forming element R to undergo a greater reduction in resistance value than application of the "+pulse voltage".

Figure 8A:
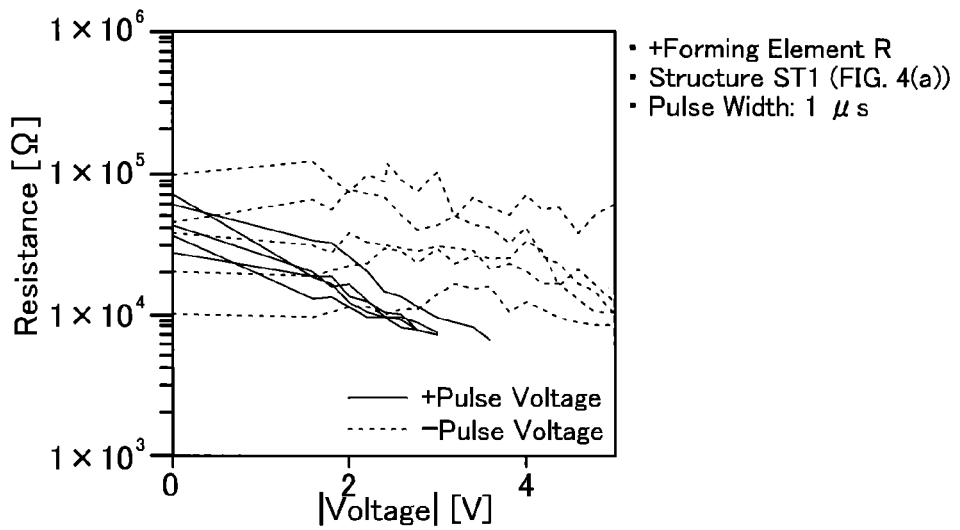
FIG. 8A is a view showing resistance varying characteristics of a −forming element R.
Figure 8B:
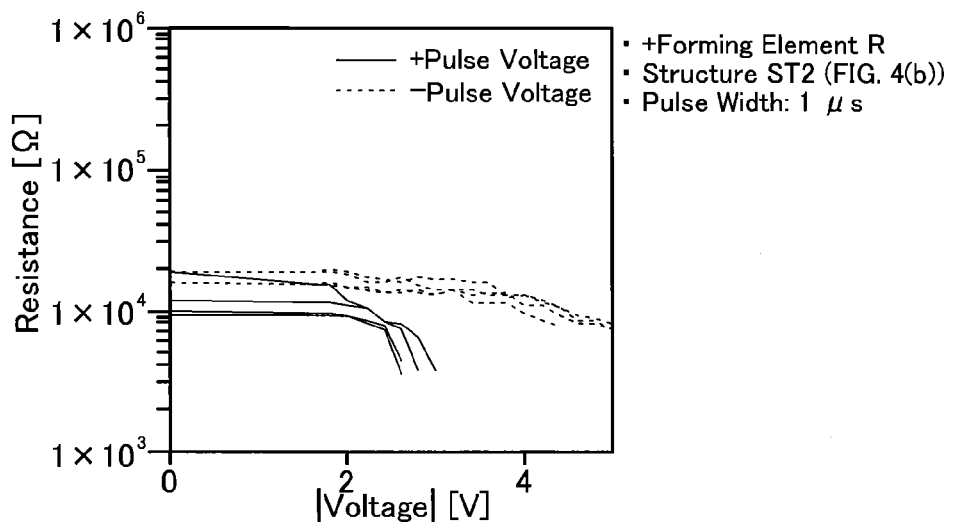
FIG. 8B is a view showing resistance varying characteristics of a −forming element R.
Figure 8C:
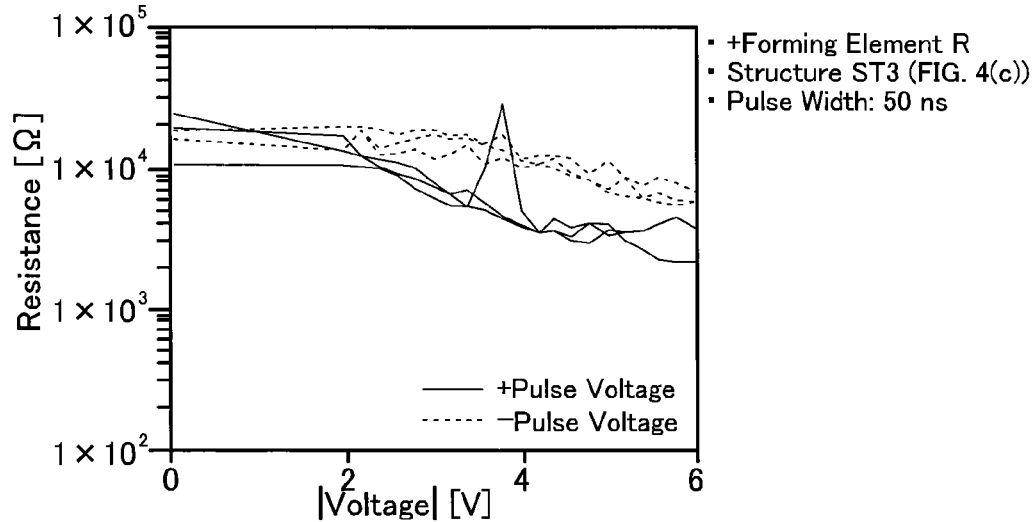
FIG. 8C is a view showing resistance varying characteristics of a −forming element R.

Next, resistance varying characteristics of a −forming element R are described with reference to FIGS. 8A to 8C. In FIGS. 8A to 8C, the horizontal axis indicates the absolute value of the pulse voltage applied to the −forming element R, and the vertical axis indicates the resistance value of the −forming element R. FIG. 8A shows results in the case where the variable resistance layer 124 of structure ST1 (FIG. 4) was adopted as the −forming element R. In addition, FIG. 8B shows results in the case where the variable resistance layer 124 of structure ST2 (FIG. 4) was adopted as the −forming element R, and FIG. 8C shows results in the case where the variable resistance layer 124 of structure ST3 (FIG. 4) was adopted as the −forming element R. Note that in FIGS. 8A and 8B, a pulse voltage of width 1 μs was applied, and in FIG. 8C, a pulse voltage of width 50 ns was applied.

As shown in FIGS. 8A to 8C, in each of the structures ST1 to ST3, application of the "+pulse voltage" caused the −forming element R to undergo a greater reduction in resistance value than application of the "−pulse voltage".

As shown above in FIGS. 7A to 7C, and 8A to 8C, the forming element R has its resistance more easily reduced in the case that a pulse voltage of reverse polarity to during forming is applied as a setting voltage than in the case that a pulse voltage of the same polarity as during forming is applied as a setting voltage. This indicates that if the setting operation is performed by a pulse voltage of reverse polarity to during forming, the pulse voltage can be reduced. Moreover, it is more difficult to reduce the resistance of the forming element R if a pulse voltage of the same polarity as during forming is applied than in the case that a pulse voltage of reverse polarity to during forming is applied. This indicates that if the resetting operation is performed by a pulse voltage of the same polarity as during forming, incorrect writes can be suppressed.

That is, in the setting operation, the forming element R is preferably applied with a pulse voltage of reverse polarity to during forming; and, in the resetting operation, the forming element R is preferably applied with a pulse voltage of the same polarity as during forming.

Figure 9:
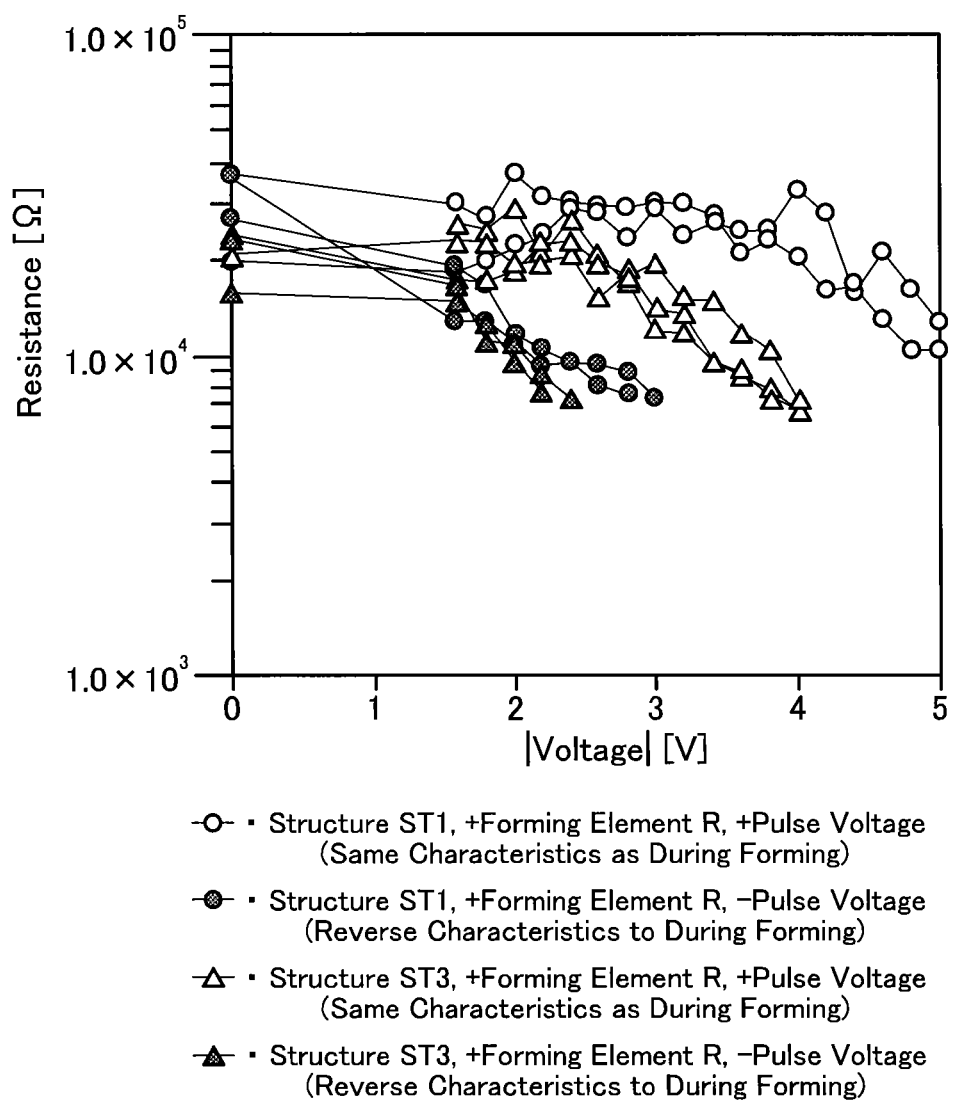
FIG. 9 is a view showing resistance varying characteristics of a +forming element R due to a difference in structure ST1 (ST3) of the variable resistance layer 124.

Next, resistance varying characteristics of the +forming element R due to differences in the structure ST1 and structure ST3 are described with reference to FIG. 9. In FIG. 9, the horizontal axis indicates the absolute value of the pulse voltage applied to the +forming element R, and the vertical axis indicates the resistance value of the +forming element R. In FIG. 9, a pulse voltage of width 1 μs commonly applied in all measurements.

As shown in FIG. 9, the difference in ease of varying the resistance value between the case where a pulse voltage of the same polarity as during forming is applied and the case where a pulse voltage of reverse polarity to during forming is applied is greater for the structure ST1 than for the structure ST3. This indicates that employing a variable resistance layer 124 of multilayer structure enables incorrect writes to be suppressed. That is, the variable resistance layer 124 is preferably of the multilayer structure ST1 rather than the single layer structure ST3.

Figure 10A:
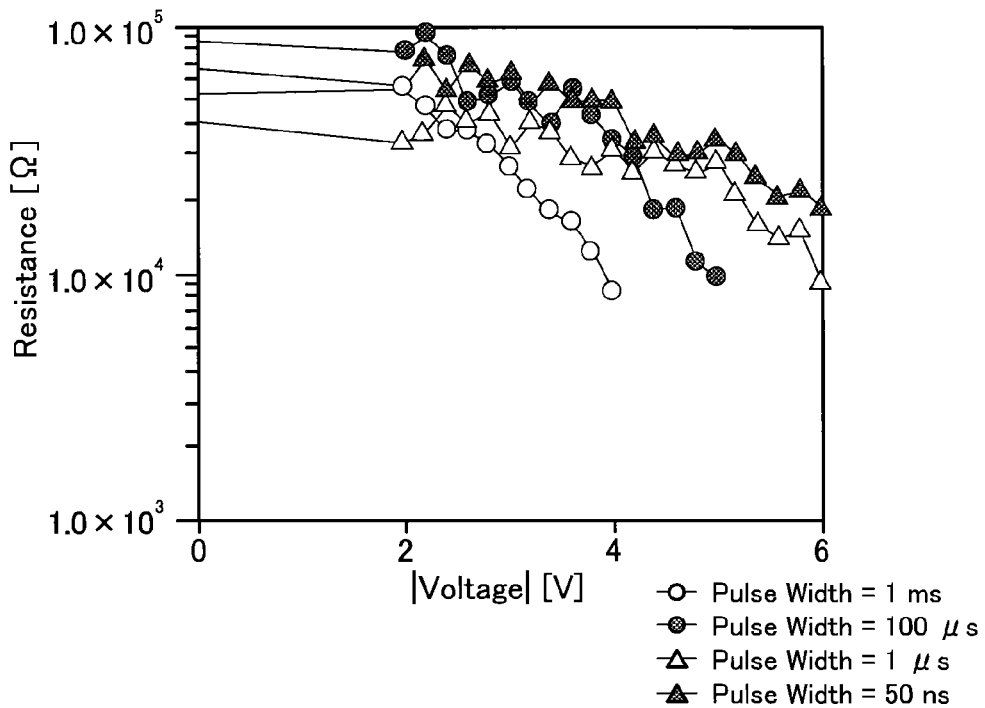
FIG. 10A is a view showing resistance varying characteristics of a −forming element R for each of differing pulse widths when a −pulse voltage is applied to the −forming element R.
Figure 10B:
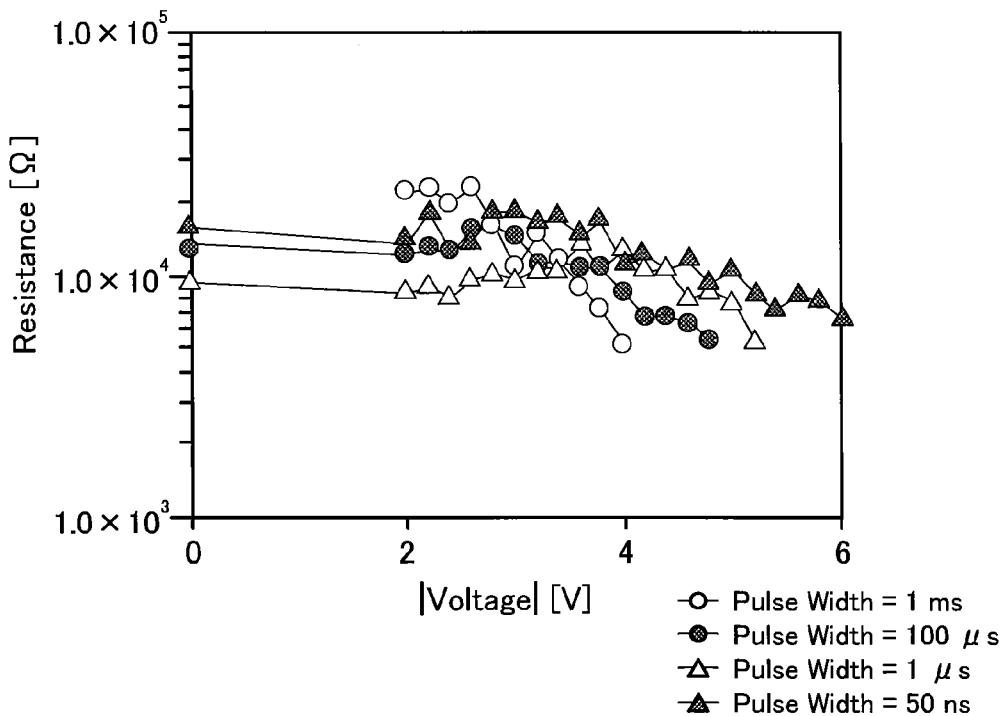
FIG. 10B is a view showing resistance varying characteristics of a −forming element R for each of differing pulse widths when a −pulse voltage is applied to the −forming element R.

Next, resistance varying characteristics of the −forming element R for each of differing pulse widths in the case where a −pulse voltage is applied to the −forming element R in the high-resistance state are described with reference to FIGS. 10A and 10B. In FIGS. 10A and 10B, the horizontal axis indicates the absolute value of the pulse voltage applied to the −forming element R in the high-resistance state, and the vertical axis indicates the resistance value of the −forming element R. Moreover, FIG. 10A shows results in the case that the variable resistance layer 124 of structure ST1 (FIG. 4) is adopted as the −forming element R, and FIG. 10B shows results in the case that the variable resistance layer 124 of structure ST3 (FIG. 4) is adopted as the −forming element R.

As shown in FIGS. 10A and 10B, lengthening the width of the −pulse voltage causes the resistance value of the −forming element R to be more greatly reduced. This indicates that, even in the case that a pulse voltage of the same polarity as during forming is employed in the resetting operation, incorrect writes occur more easily if the width of the pulse voltage is lengthened.

Figure 11A:
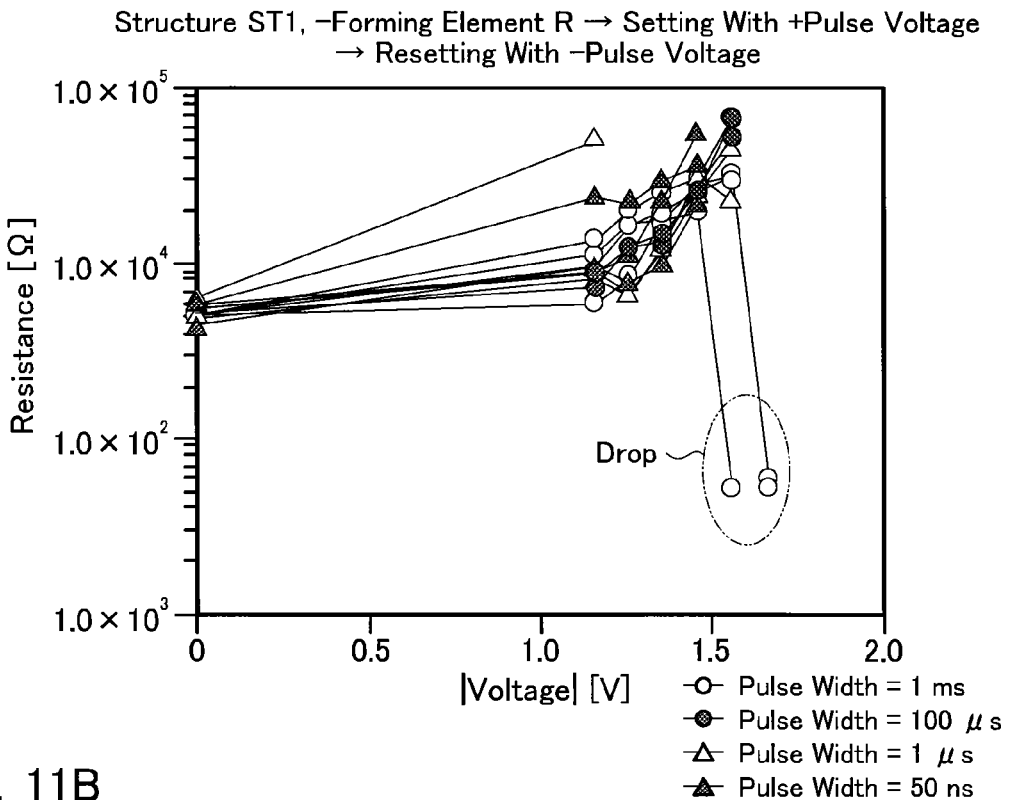
FIG. 11A is a view showing resistance varying characteristics of a −forming element R for each of differing pulse widths when the resetting operation (application of −pulse voltage) is executed on the −forming element R subsequent to execution of the setting operation (application of +pulse voltage).
Figure 11B:
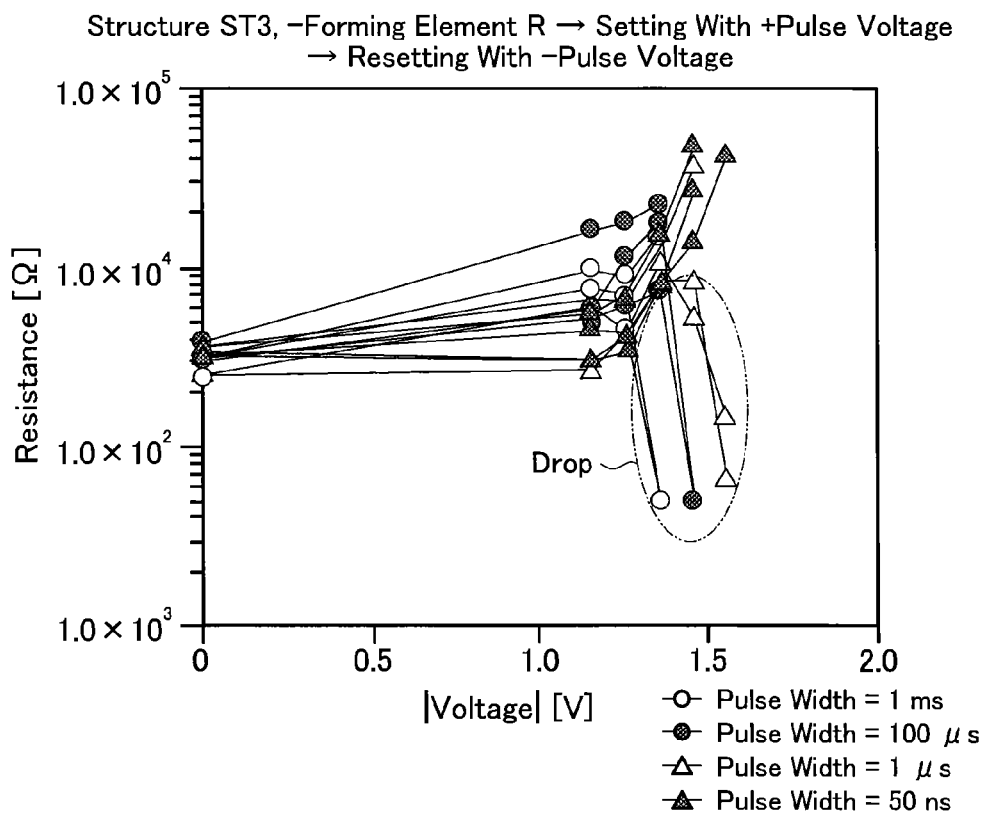
FIG. 11B is a view showing resistance varying characteristics of a −forming element R for each of differing pulse widths when the resetting operation (application of −pulse voltage) is executed on the −forming element R subsequent to execution of the setting operation (application of +pulse voltage).

Resistance varying characteristics of the −forming element R for each of differing pulse widths when the resetting operation (application of −pulse voltage) is executed on the −forming element R subsequent to execution of the setting operation (application of +pulse voltage) on the −forming element R are described specifically with reference to FIGS. 11A and 11B. In FIGS. 11A and 11B, the horizontal axis indicates the absolute value of the pulse voltage applied to the −forming element R during the resetting operation, and the vertical axis indicates the resistance value of the −forming element R. Moreover, FIG. 11A shows results in the case that the variable resistance layer 124 of structure ST1 (FIG. 4) is adopted as the −forming element R, and FIG. 11B shows results in the case that the variable resistance layer 124 of structure ST3 (FIG. 4) is adopted as the −forming element R.

As shown in FIGS. 11A and 11B, during the resetting operation, the longer the width of the −pulse voltage becomes, the easier it is for the −forming element R to first have its resistance increased to a certain extent and then have its resistance reduced again. For example, in the case where the width of the −pulse voltage was set to 1 ms in the structure ST1 shown in FIG. 11A, when the −pulse voltage was set larger than 1.5 V, the −forming element R became low-resistance. For example, in the case where the width of the −pulse voltage was set to 1 ms, 100 μs, or 1 μs in the structure ST3 shown in FIG. 11B, the −forming element first had its resistance increased to a certain extent and then had its resistance reduced. Moreover, as shown in FIG. 11B, the longer the pulse width, the smaller the absolute value of the voltage at which the −forming element R becomes low-resistance. This indicates directly that, even in the case that a pulse voltage of the same polarity as the forming operation is employed in the resetting operation, incorrect writes occur more easily if the width of the pulse voltage is lengthened, similarly to FIGS. 10A and 10B.

That is, as shown in FIGS. 10A and 10B, and 11A and 11B, the width of the resetting pulse voltage employed during the resetting operation is preferably as short as possible, specifically, a width of less than 1 μs being appropriate.

[Advantages]

Next, advantages of the first embodiment are described. As shown in FIG. 6, the nonvolatile semiconductor memory device in accordance with the first embodiment has a +pulse voltage applied to the variable resistor R during forming, a −pulse voltage applied to the +forming element R (variable resistor R) during setting, and a +pulse voltage applied to the +forming element R during resetting. Alternatively, the first embodiment has a −pulse voltage applied to the variable resistor R during forming, a +pulse voltage applied to the −forming element R (variable resistor R) during setting, and a −pulse voltage applied to the −forming element R during resetting. Accordingly, as shown in FIGS. 7A to 7C, and 8A to 8C, the first embodiment enables the pulse voltage during setting to be reduced and incorrect writes during resetting to be suppressed.

In addition, as shown in FIG. 1, the nonvolatile semiconductor memory device according to the first embodiment comprises the current limiting circuits 21 and 31 for limiting the current in the +direction and the −direction. Consequently, the first embodiment enables the current flowing in the memory cell MC at the moment when the variable resistor has its resistance value reduced to be limited, and enables deterioration of element characteristics to be suppressed.

In addition, as shown in FIG. 4, the variable resistance layer 124 in accordance with the first embodiment is configurable by the stacking structures ST1 and ST2 having the two metal oxide layers 123a and 123b that differ from each other. Therefore, as shown in FIG. 9, the first embodiment enables incorrect writes during the resetting operation to be suppressed more than in the case of a single layer metal oxide layer.

Moreover, the nonvolatile semiconductor memory device according to the first embodiment applies a pulse voltage of width less than 1 μs during the resetting operation. Therefore, as shown in FIGS. 10A, 10B, 11A, and 11B, the first embodiment enables incorrect writes during the resetting operation to be suppressed.

Second Embodiment

Configuration

Figure 12:
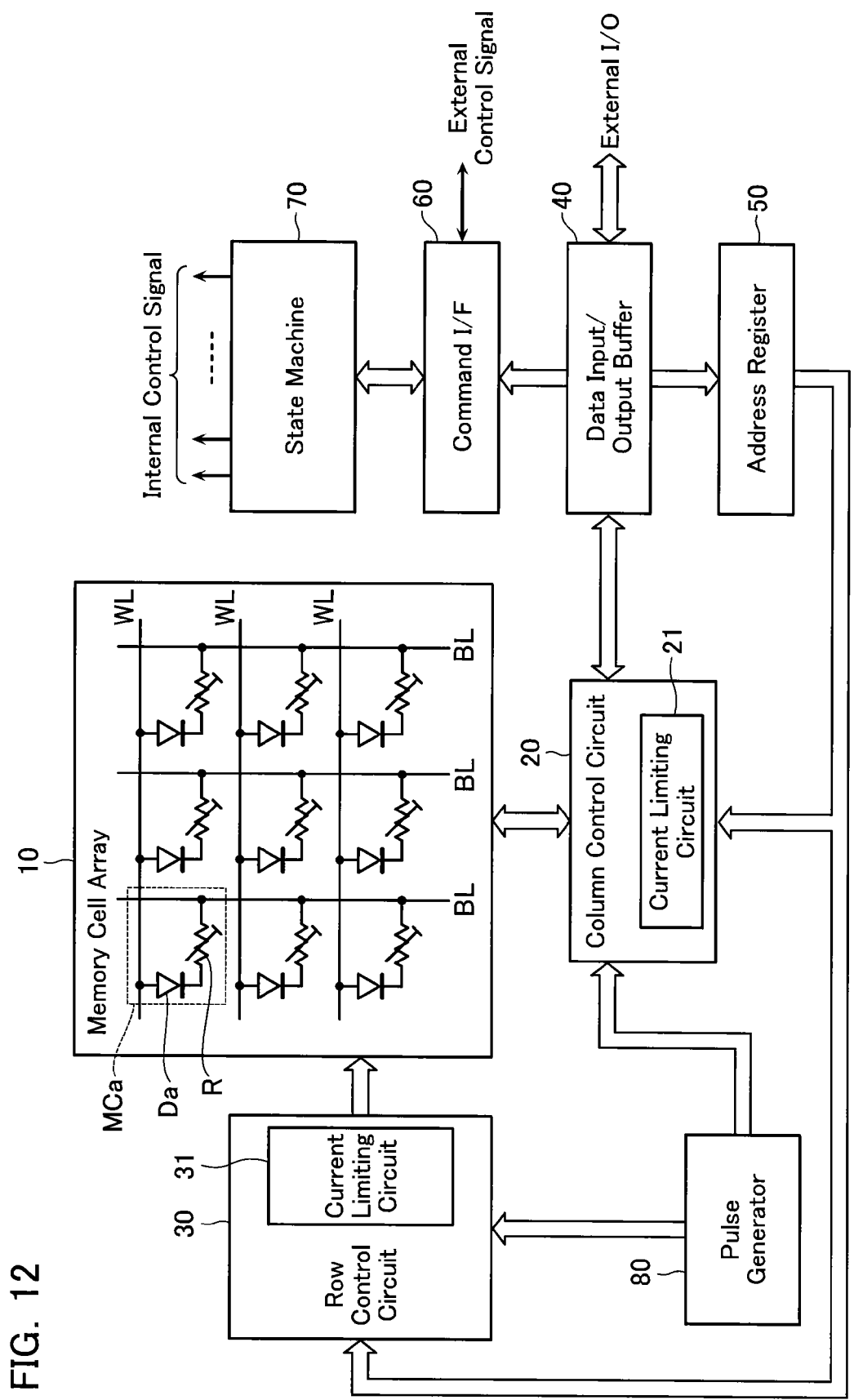
FIG. 12 is a block diagram showing a nonvolatile semiconductor memory device in accordance with a second embodiment of the present invention.

Next, a configuration of a nonvolatile semiconductor memory device in accordance with a second embodiment is described with reference to FIG. 12. As shown in FIG. 12, the second embodiment includes a memory cell MCa having the variable resistor R and an ordinary diode Da connected in series. The second embodiment differs from the first embodiment in this point but is similar to the first embodiment in other configurations. The diode Da has its anode connected to the word line WL and its cathode connected to one end of the variable resistor R. Note that in the second embodiment, identical symbols are assigned to configurations similar to those in the first embodiment and descriptions thereof are omitted.

[Operation]

In the second embodiment, the "+pulse voltage" causes a current to flow in the forward bias direction of the diode Da. The "−pulse voltage" causes a current to flow in the reverse bias direction of the diode Da. At this time, a rising time of the "−pulse voltage" has a feature of being shorter than a rising time of the "+pulse voltage". Specifically, the rising time of the "−pulse voltage" is shorter than a time determined on the basis of the product of the resistance value of the variable resistor R in the low-resistance state and a value of the coupling capacitance of the diode Da, and is determined using a transiently-flowing charging current of the coupling capacitance. The variable resistor R in the second embodiment is applied with a "+pulse voltage" during the forming operation to become a +forming element R. The +forming element R is applied with a "−pulse voltage" during the setting operation. In addition, the +forming element R is applied with a "+pulse voltage" during the resetting operation.

[Advantages]

The second embodiment has a configuration similar to that of the first embodiment, and thus displays similar advantages to the first embodiment.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, a structure may be adopted in which two memory layers 12 (memory cells MC) positioned one above the other share a single first conductive layer (word line WL) or a single second conductive layer 13 (bit line BL). For example, in the above-described embodiments, the electrode layers 121, 123, and 125 are each configured by titanium or titanium nitride, but it is also possible for at least one of the electrode layers 123 and 125 to be configured by titanium or titanium nitride and for others of the electrode layers to be configured by another metal. For example, the variable resistance layer 124 need not be limited to the structures ST1 to ST3, and may have a stacking structure of two or more layers of metal oxides that differ from each other.

What is claimed is:

1. A nonvolatile semiconductor memory device, comprising:
a plurality of first lines;
a plurality of second lines extending so as to intersect the first lines;
a plurality of memory cells disposed at intersections of the first lines and the second lines, each of the memory cells including a variable resistor; and
a control circuit for controlling a voltage applied to the memory cells, the plurality of memory cells being able to change from a write state to an erase state in which resistance value of the memory cell is higher than that of in the write state and being able to change from the erase state to the write state, the control circuit applying a first pulse voltage to the variable resistor in an initial state in which resistance value of the memory cell is higher than that of in the erase state during a forming operation to change the memory cell from the initial state to the erase state, applying a second pulse voltage to the variable resistor in the erase state during a setting operation to change the memory cell from the erase state to write state, the setting operation being performed subsequent to the forming operation, and the second pulse voltage having a polarity opposite to the first pulse voltage.

2. The nonvolatile semiconductor memory device according to claim 1, wherein
each of the memory cells further includes a diode connected in series with the variable resistor.

3. The nonvolatile semiconductor memory device according to claim 2, wherein
the first pulse voltage causes a current of a forward bias direction of the diode to flow in the memory cells.

4. The nonvolatile semiconductor memory device according to claim 1, wherein
the control circuit comprises a current limiting circuit for limiting a current flowing in the memory cells in a first direction and in a second direction.

5. The nonvolatile semiconductor memory device according to claim 1, wherein
the variable resistor is configured by a stacking structure of two or more different layers of metal oxide.

6. The nonvolatile semiconductor memory device according to claim 5, wherein
the variable resistor comprises:
a first metal oxide layer configured by hafnium oxide; and
a second metal oxide layer in contact with the first metal oxide layer and configured by titanium oxide.

7. The nonvolatile semiconductor memory device according to claim 1, wherein
the control circuit applies a third pulse voltage to the variable resistor during a resetting operation, the third voltage having a polarity identical to the first pulse voltage,
during the resetting operation, the third pulse voltage has a width of less than 1 μs.

8. The nonvolatile semiconductor memory device according to claim 2, wherein
a rising time of a pulse voltage causing a current to flow in the reverse bias direction of the diode is shorter than a rising time of a pulse voltage causing a current to flow in the forward bias direction of the diode.

9. The nonvolatile semiconductor memory device according to claim 1, wherein
a pair of the memory cells shares one of the first lines.

* * * * *